(12) United States Patent
Schulte et al.

(10) Patent No.: US 8,754,663 B2
(45) Date of Patent: Jun. 17, 2014

(54) CIRCUIT FOR SIMULATING AN ELECTRICAL LOAD

(75) Inventors: Thomas Schulte, Paderborn (DE); Joerg Bracker, Delbrueck (DE)

(73) Assignee: Dspace Digital Signal Processing and Control Engineering GmbH, Paderborn (DE)

(*) Notice: Subject to any disclaimer, the term of this patent is extended or adjusted under 35 U.S.C. 154(b) by 543 days.

(21) Appl. No.: 13/054,594

(22) PCT Filed: Jul. 15, 2009

(86) PCT No.: PCT/EP2009/059073
§ 371 (c)(1),
(2), (4) Date: Jan. 18, 2011

(87) PCT Pub. No.: WO2010/010022
PCT Pub. Date: Jan. 28, 2010

(65) Prior Publication Data
US 2011/0133763 A1    Jun. 9, 2011

(30) Foreign Application Priority Data
Jul. 21, 2008  (DE) .................. 10 2008 034 109

(51) Int. Cl.
*G01R 31/00* (2006.01)
*G01R 31/02* (2006.01)
*G01R 31/327* (2006.01)
G05B 1/03 (2006.01)
H02M 1/00 (2006.01)

(52) U.S. Cl.
CPC ............. *G01R 31/02* (2013.01); *G01R 31/327* (2013.01); *G05B 1/03* (2013.01); *H02M 1/00* (2013.01)
USPC ...... 324/750.01; 324/500; 324/354; 324/415; 324/522; 324/713; 324/725; 324/526; 324/648; 324/657; 703/4; 327/84; 327/423; 327/588

(58) Field of Classification Search
CPC ........ G01R 31/02; G01R 31/327; G05B 1/03; H02M 1/00
USPC ............ 324/750.01, 500, 354, 415, 522, 713, 324/725, 526, 648, 657; 327/84, 423, 588; 703/4
See application file for complete search history.

(56) References Cited

U.S. PATENT DOCUMENTS 3,756,837 A * 9/1973 Weber et al. ............... 106/14.25
4,680,537 A * 7/1987 Miller .......................... 324/500

(Continued)

FOREIGN PATENT DOCUMENTS

CN    1186376 A    7/1998
CN    1591264 A    3/2005

(Continued)

OTHER PUBLICATIONS

Atena, "Media Information Atena presents the simulation module of an electric machine (SimuleD) for the application in HIL test systems." Aetna, Germany.

(Continued)

*Primary Examiner* — Patrick Assouad
*Assistant Examiner* — Lamarr Brown
(74) *Attorney, Agent, or Firm* — Leydig, Voit & Mayer, Ltd.

(57) ABSTRACT

A circuit for simulating an electrical load at a terminal of a test circuit having at least one first switch and at least one second switch includes a third switch connected to the first switch of the test circuit via a first external connection point. A fourth switch is connected to the second switch of the test circuit via a second external connection point. The first switch and the second switch are connected via a shared, first internal connection point to the terminal of the test circuit and the third switch and the fourth switch are connected via a shared, second internal connection point such that that the first switch, the second switch, the third switch and the fourth switch form an H-bridge circuit. A voltage source is configured to provide the first and second external connection points with a supply voltage. A controllable voltage source is connected in a transverse bridge branch between the terminal and the second internal connection point. An inductance is active in the transverse bridge branch. A current-control unit is operable on the controllable voltage source so as to adjust, to a predetermined setpoint current, an actual current flowing over the terminal of the test circuit and over the transverse bridge branch.

19 Claims, 10 Drawing Sheets

(56) References Cited

U.S. PATENT DOCUMENTS

| | | | | |
|---|---|---|---|---|
| 4,797,904 | A * | 1/1989 | Dekker et al. | 375/296 |
| 4,920,448 | A | 4/1990 | Bonhomme | |
| 5,949,158 | A * | 9/1999 | Schulz | 307/127 |
| 6,367,021 | B1 * | 4/2002 | Shay | 713/300 |
| 6,498,494 | B2 * | 12/2002 | Belau et al. | 324/522 |
| 6,597,138 | B2 * | 7/2003 | Fitzgibbon | 318/434 |
| 6,621,301 | B1 * | 9/2003 | Mattes et al. | 326/86 |
| 6,768,296 | B2 * | 7/2004 | Fiedler et al. | 324/117 R |
| 7,375,986 | B2 * | 5/2008 | Schmitt et al. | 363/17 |
| 8,138,705 | B2 * | 3/2012 | Klemm et al. | 318/509 |
| 2001/0009374 | A1 * | 7/2001 | Yagi | 324/713 |
| 2001/0030542 | A1 * | 10/2001 | Martin | 324/500 |
| 2002/0049577 | A1 * | 4/2002 | Scherr | 703/14 |
| 2002/0149412 | A1 * | 10/2002 | Fiedler et al. | 327/291 |
| 2003/0227304 | A1 * | 12/2003 | Saito et al. | 327/108 |
| 2004/0095183 | A1 * | 5/2004 | Swize | 327/423 |
| 2004/0145359 | A1 * | 7/2004 | Cummings | 323/282 |
| 2004/0216021 | A1 * | 10/2004 | Matsuda et al. | 714/728 |
| 2004/0227530 | A1 * | 11/2004 | Hartzsch | 324/713 |
| 2004/0239401 | A1 * | 12/2004 | Liao | 327/423 |
| 2005/0040796 | A1 | 2/2005 | Sutardja | |
| 2006/0004415 | A1 * | 1/2006 | Bucher | 607/5 |
| 2006/0043981 | A1 * | 3/2006 | Drouin et al. | 324/713 |
| 2006/0081067 | A1 * | 4/2006 | Budmiger | 73/861.08 |
| 2006/0119368 | A1 * | 6/2006 | Sela et al. | 324/522 |
| 2007/0080744 | A1 * | 4/2007 | Arndt et al. | 327/546 |
| 2007/0252635 | A1 * | 11/2007 | Otoshi et al. | 327/423 |
| 2007/0279068 | A1 * | 12/2007 | Harres | 324/522 |
| 2008/0270090 | A1 * | 10/2008 | Bracker et al. | 703/4 |
| 2009/0121724 | A1 * | 5/2009 | Perryman et al. | 324/522 |
| 2009/0179606 | A1 * | 7/2009 | Klemm et al. | 318/509 |
| 2009/0267587 | A1 * | 10/2009 | Tateno et al. | 323/316 |
| 2010/0026370 | A1 * | 2/2010 | Mazzola et al. | 327/423 |
| 2011/0042465 | A1 * | 2/2011 | Smets et al. | 235/492 |
| 2012/0119765 | A1 * | 5/2012 | Bracker et al. | 324/750.01 |
| 2012/0150503 | A1 * | 6/2012 | Haupt et al. | 703/2 |
| 2012/0250203 | A1 * | 10/2012 | Makihara | 361/86 |
| 2013/0106200 | A1 * | 5/2013 | Wagner et al. | 307/125 |
| 2013/0106451 | A1 * | 5/2013 | Scheuschner et al. | 324/750.01 |
| 2013/0169262 | A1 * | 7/2013 | Hartman | 323/351 |
| 2013/0241585 | A1 * | 9/2013 | Inzunza Figueroa et al. | 324/750.01 |

FOREIGN PATENT DOCUMENTS

| | | |
|---|---|---|
| DE | 36 88 469 T2 | 10/1993 |
| EP | 0 393 847 A1 | 10/1990 |
| EP | 2048554 A1 | 4/2009 |
| JP | 2005045981 A | 2/2005 |
| JP | 2006 189 554 A | 7/2006 |
| WO | WO 2007/042228 A1 | 4/2007 |
| WO | WO2007042228 * | 4/2007 |

OTHER PUBLICATIONS

Atena, "StimuleD Simulator Electric Drive Simulation of hybrid engines for development support of equivalent control units" Aetna, Germany.

Ferreira. et al. "Of zero-emission electronic FVA Test bench Realization of high switch frequency with Umrichtern with Standard-IGBTs" Umrichter Research & Development(2007) 5, pp. 44-45, Germany.

Hammerer, "Model-based simulation from electric motors" Electronics (2007) 24, pp. 1-5, Germany.

Wagener et al., "Hardware-in-the-Loop Test Systems for Electric Motors in Advanced Powertrain Applications" SAE International (2007) 2007-01-498. Germany.

* cited by examiner

CIRCUIT FOR SIMULATING AN ELECTRICAL LOAD

CROSS-REFERENCE TO PRIOR APPLICATIONS

This application is a U.S. National Phase application under 35 U.S.C. §371 of International Application No. PCT/EP2009/059073, filed Jul. 15, 2009, and claims benefit to German Application No. 10 2008 034 109.6, filed Jul. 21, 2008. The International Application was published in German on Jan. 28, 2010 as WO 2010/010022 under PCT Article 21(2).

FIELD

The present invention relates to a circuit for simulating an electrical load at a terminal of a test circuit.

BACKGROUND

Circuits for simulating an electrical load are frequently used in cases where a circuit to be tested—referred to as test circuit—is to be checked for the functionality thereof, without having to bring the test circuit to its "real" working environment.

Typical application fields include simulators—test environments—, for example, for testing control units having power electronic interfaces. In this case, the control units—for example, motor controllers—make up the test circuit, the intention being to test whether the control units react in the desired manner, thus whether the control unit reacts to specific state variables—received via its interfaces—by outputting—via its interface—appropriate output quantities. To that end, the environment that is relevant to such a test circuit is completely or partially simulated. For example, in the case of a motor controller, the motor to be controlled can be—completely or partially—simulated, for example, with the aid of a simulation computer or a plurality of simulation computers having I/O interfaces. For this purpose, a mathematical map of the motor is first created, which brings the characteristic data and state variables of the motor into a calculable interrelationship. The variables—control signals—acting on the—simulated—motor are received by the simulation computer via an I/O interface, and state variables of the—simulated—motor are calculated in the simulation computer, inter alia, on the basis of this information using the mathematical model. Specific state variables are typically made available to the motor controller again via the I/O interface, respectively the I/O interfaces, to the extent that they are requested by the motor controller as inputs. This approach generally has the important inherent advantage that a large spectrum of test cases can be tested while entailing only little outlay, and modified control unit environments—for example, different drive units—can also be simulated.

In the motor controller example under consideration here, such a simulator not only receives signals in the low-level signal range from a test circuit, but also high-level electric signals, when the test circuit is provided with power electronic outputs, as is the case, for example, in the control of electric drives.

In practice, the circuits for simulating an electrical load are frequently operated in such a way that the voltage at the output of the test circuit—thus, for example, the voltage at the output of the power section of a motor controller—is measured metrologically; a corresponding (motor) current, that would have to flow over the terminal of the test circuit, is calculated using a mathematical model of the motor to be simulated, taking into consideration the operating data of the motor; and this setpoint current value is transmitted to the current-control unit which then adjusts the ascertained setpoint current as closely to real time as possible by controlling the circuit at the terminal of the test circuit accordingly.

The World Patent Application WO 2007/042228 A1 describes a circuit, for example, that uses a coil as an electrical energy storage device, whose inductance is substantially lower than that of the winding of an electric motor to be simulated. Controlling an electric motor typically requires a plurality of terminals because such drives, which are operated at relatively high power levels, are to be controlled in a multiphase—usually three-phase—operation. Present at the terminal of the test circuit is typically a pulse-width modulated (PWM) voltage signal, via whose pulse duty factor, the voltage present on average over time at the terminal can be adjusted. The coil is connected by its other terminal via a half-bridge circuit to two auxiliary voltage sources, so that, by switching the one switch of the half-bridge circuit, this second terminal of the coil can be connected to a high potential, and, by switching the other switch of the bridge circuit, the second terminal of the coil can be connected to a very low potential. It is thus possible to influence the current flow within the coil and to adjust, respectively control the actual value of the current at the terminal of the test circuit to the value of a predefined setpoint current.

Under the related art, the voltage source is composed of the supply voltage of the test circuit and of two auxiliary voltage sources connected thereto. Energy can be altogether withdrawn from the circuit by bringing one of the two auxiliary voltage sources onto load, thereby reducing the current in the coil.

Metal-oxide-semiconductor field-effect transistors (MOSFETs) are typically used as switches for the half-bridge circuit. They allow considerably high switching frequencies. Therefore, high switching frequencies are required for the MOSFETs because a "smooth" curve of the actual current can only be achieved by activating the half-bridge circuit at high frequency. For this reason, the switching frequency of the MOSFETs in the half-bridge circuit is much greater than the frequency of the PWM voltage signal at the output of the test circuit.

Very high currents and voltages are to be applied by the energy stage of the test circuit, for example, when drive units of passenger cars having an electric drive, as used, for example, in hybrid or electric-powered vehicles, are to be controlled. It is not unusual for drives of this kind to be operated at power levels within the range of some 10 kW up to approximately 100 kW. Particularly when working with very dynamic load variations, it is necessary to have control over voltages at the terminal of the test circuit that are within the kV range and over currents that may be within the range of some 10 A and, at peak, several 100 A. However, at such high power levels, which are to be converted in the simulated electrical load, the MOSFET circuit elements described above reach their limits since they are no longer able to block the voltages occurring during switchover operations, without causing destruction, due to a too low dielectric strength. It is not readily possible to use more rugged circuit elements, such as IGBT transistors (insulated gate bipolar transistors), for example, since the requisite high switching frequencies are not reached in this case.

Some of the related-art approaches have the further disadvantage that comparatively high power levels are converted in the circuit for simulating a load, entailing significant power losses.

SUMMARY

In an embodiment, the present invention provides a circuit for simulating an electrical load at a terminal of a test circuit, the test circuit having at least one first switch and at least one second switch. The circuit includes a third switch connected to the at least one first switch of the test circuit via a first external connection point. A fourth switch is connected to the at least one second switch of the test circuit via a second external connection point. The at least one first switch and the at least one second switch are connected via a shared, first internal connection point to the terminal of the test circuit and the third switch and the fourth switch are connected via a shared, second internal connection point such that that the at least one first switch, the at least one second switch, the third switch and the fourth switch form an H-bridge circuit. A voltage source is configured to provide the first external connection point and the second external connection point with a supply voltage. A controllable voltage source is connected in a transverse bridge branch between the terminal and the second internal connection point. An inductance is active in the transverse bridge branch. A current-control unit is operable on the controllable voltage source so as to adjust, to a predetermined setpoint current, an actual current flowing over the terminal of the test circuit and over the transverse bridge branch.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
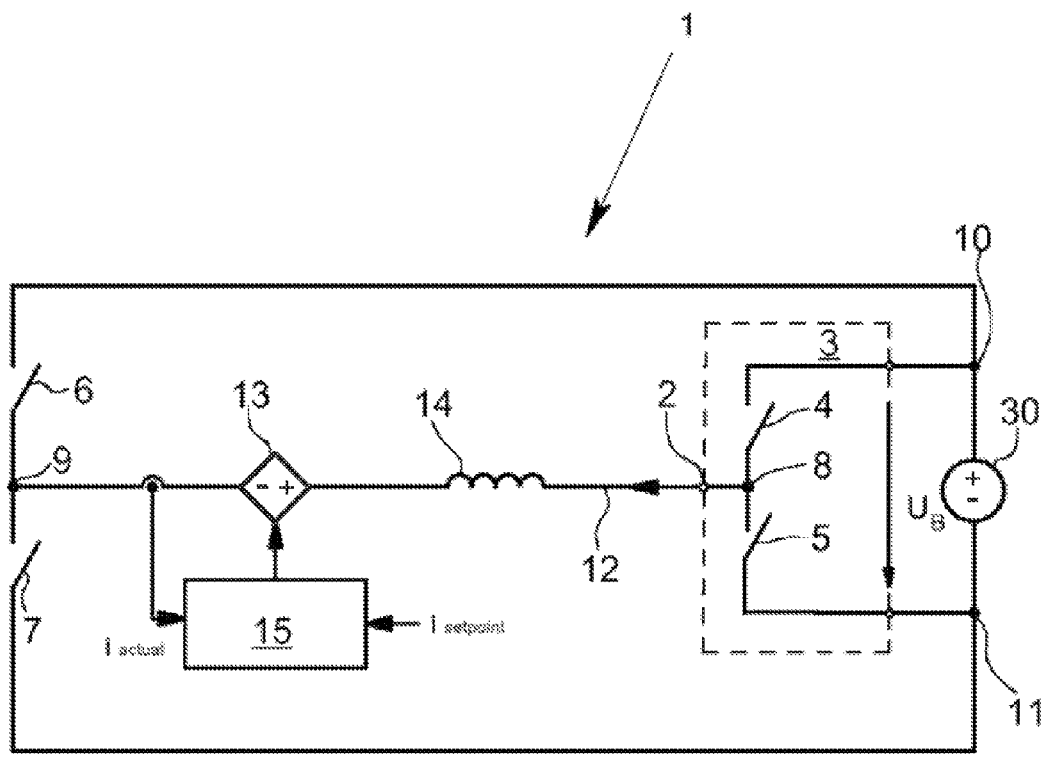
FIG. 1 shows a schematic circuit diagram of the circuit according to an embodiment of the present invention for simulating an electrical load.

In an embodiment, the present invention provides a circuit for simulating an electrical load at a terminal of a test circuit, the test circuit having at least one first switch and one second switch; the circuit having a third switch and a fourth switch; the first switch and the second switch of the test circuit being connected via a shared first internal connection point to the terminal of the test circuit; the third switch and the fourth switch being interconnected via a shared, second internal connection point; the first switch and the third switch being interconnected via a first external connection point; and the second switch and the fourth switch being interconnected via a second external connection point, so that the first switch, the second switch, the third switch and the fourth switch form an H-bridge circuit; a supply voltage UB from a voltage source is supplied to the first external connection point and the second external connection point; and the actual current iactual flowing over the terminal of the test circuit flows over the transverse bridge branch configured between the terminal and the second connection point; an inductance that is active in the transverse bridge branch being provided.

It is an aspect of the present invention to—at least partially—avoid the disadvantages described above in the case of the prior circuits for simulating an electrical load of the type in question and, in particular, to provide a circuit that is suited for simulating substantial loads at high voltages and power levels.

The circuit according to an embodiment of the present invention for simulating an electrical load for which the above derived and discussed objective is achieved, is initially and essentially characterized in that a controllable voltage source is provided in the transverse bridge branch, and actual current $i_{actual}$ is adjustable by a current-control unit acting on the controllable voltage source to the value of a predefined setpoint current $i_{setpoint}$.

It is readily possible to use the controllable voltage source in the transverse bridge branch to adjust the magnitude and direction of actual current $i_{actual}$. For one thing, this naturally requires that the current-control unit record the actual current metrologically (in whatever manner this is realized); that it compare it to the value of predefined setpoint current $i_{setpoint}$ and transmit a corresponding control signal to the controllable voltage source. As long as the first switch and the second switch of the test circuit, as well as the third switch and the fourth switch of the circuit are connected in such a way that a closed electric circuit, including the transverse bridge branch, is obtained, the controllable voltage source is active in the transverse bridge branch. There are different ways to implement the controllable voltage source in the transverse bridge branch.

One first embodiment of the present invention provides that the voltage supplied by the controllable voltage source be directly coupled via a galvanic coupling in the transverse bridge branch, whereas another preferred embodiment of the prevent invention provides that the voltage supplied by the controllable voltage source be coupled indirectly into the transverse bridge branch via an inductive coupling, namely, in particular, via a transformer.

In the case of the last mentioned voltage that is supplied by the indirect coupling of the controllable voltage source, the actual current is thus regulated on the primary side, the secondary side of the transformer being interconnected in the transverse bridge branch of the H-bridge circuit. In the case of the approach which provides for inductive coupling of the controllable voltage source, it should be noted that only variable current components may be regulated in the transverse bridge branch via the controllable voltage source and the inductive coupling since a direct voltage is not transmittable via an inductive coupling. The direct voltage component, respectively the direct current component must then be regulated by suitable circuits of the third switch and of the fourth switch of the circuit as a function of the switching of the first and second switch of the test circuit. Based on these considerations, the controllable voltage source is preferably a "rapidly" controllable voltage source, which, at any rate, must be so fast that the transient current components in the transverse bridge branch are adjustable to the desired setting speed.

One preferred embodiment of the controllable voltage source features a four-quadrant capable switchover device having an internal voltage source, this internal voltage source being designed, in particular, as an energy storage device, preferably as a capacitor. A four-quadrant capable switchover device allows the internal voltage source to be connected in any given orientation—polarity—to the external connection points of the switchover device, so that the internal voltage source is capable of variably introducing its supply voltage into the transverse bridge branch; this is true whether a direct or an indirect coupling of the voltage supplied by the voltage source is provided. It is preferably provided in this context that the four-quadrant capable switchover device have a first switch, a second switch, a third switch and a fourth switch, the first switch being connected via a first bridge connection to the second switch, the second switch being connected to the fourth switch, the fourth switch being connected via a second bridge connection to the third switch, and the third switch being connected to the first switch, the internal voltage source being connected to the shared connection of the first switch and the third switch and to the shared connection of the second switch and the fourth switch, it preferably being provided for the internal voltage source to be a capacitor or another accumulator or another electronic voltage source, such as a DC/DC converter. The voltage source is, therefore, realized by the internal voltage source, and the controllability of the voltage source is ensured by the four-quadrant capable switchover devices.

In the case of the direct coupling of the previously described four-quadrant capable switchover device into the transverse bridge branch, a cascaded H-bridge circuit is virtually formed, the first and the second switch of the test circuit, and the third switch and the fourth switch of the circuit forming the external H-bridge, and the four switches of the four-quadrant capable switchover device forming the internal H-bridge. The disadvantage associated with this variant is that, when the external H-bridge is switched over, the switchover device is connected to a jumping potential, whereby parasitic capacitances become active, for example, and the increase and decrease in potential induce unwanted currents which lead to a common-mode interference. This problem is then resolved when the controllable voltage source, which is realized as a four-quadrant capable switchover device, is inductively coupled into the transverse bridge branch; thus, the four-quadrant capable switchover device is not in galvanic contact with the transverse bridge branch, so that no jumping potentials occur at the switchover device even when the switchover device—the external H-bridge—is switched over, making it possible in this case to substantially avoid common-mode interferences.

As discussed above, an active inductance is provided in the transverse bridge branch and that the current regulation is then carried out via this active inductance. In terms of circuit engineering, this inductance, that is active in the transverse bridge branch, may be realized as a separate component—thus, as a coil; however, the active inductance may also—or additionally—be realized, not as a separate component, but simply as a parasitic leakage or line inductance that is present. When the controllable voltage source is coupled indirectly into the transverse bridge branch, the inductance that is active in the transverse bridge branch may also be present, in terms of a component, as a coil on the primary side in the controllable voltage source, and/or be present as a leakage inductance of the transformer and nevertheless—due to the inductive coupling—be active as inductance in the transverse bridge branch. The inductance may then be realized, in particular, by the selective design as a leakage transformer or as a dual-winding coil.

Altogether, therefore, one preferred embodiment provides for the circuit according to the present invention is to be operated in a "power-neutral" or in a "power-consuming or supplying" mode. In one preferred embodiment, the circuit is configured in the power-neutral operation in such a way that the third switch of the circuit is synchronously operated with the first switch of the test circuit, and the fourth switch of the circuit is synchronously operated with the second switch of the test circuit, the first switch of the test circuit and the third switch of the circuit being operated in push-pull mode in synchronism with the second switch of the test circuit and the fourth switch of the circuit. In the case of this cooperation of the four switches, the voltage source is inactive since it is not switched into the closed current path where the transverse bridge branch is located.

On the other hand, in the power-consuming or supplying operation, the voltage source is actively switched into the bridge branch, so that, altogether, it influences the current flow in the transverse bridge branch as well. To this end, unlike the previously described synchronous operating mode, the third switch of the circuit is briefly connected asynchronously to the first switch of the test circuit, and/or the fourth switch of the circuit is not connected synchronously to the second switch of the test circuit, but rather with a certain delay, so that a chronologically overlapping operating mode of the first switch of the test circuit with the fourth switch of the circuit, respectively, of the second switch of the test circuit with the third switch of the circuit is realized. In the case that the internal voltage source is realized as an energy storage device, in particular as a capacitor or battery, given a galvanic coupling of the controllable voltage source, the power-consuming or supplying operation may be utilized to charge or discharge the energy storage device.

In another preferred embodiment of the present invention, the circuit is altogether operated in such a way that, particularly in the case that the controllable voltage source is coupled inductively, care must be taken to ensure that the coils and/or transformers involved do not enter into magnetic saturation, because then, a primary-side current change no longer effects a change in flux and, accordingly, on the secondary side as well—thus in the transverse bridge branch—no current or voltage change is effected, so that a regulation is no longer possible. In one preferred embodiment of the circuit, this occurs in that, given an inductive coupling of the controllable voltage source to the bridge branch, the power-consuming or supplying operation is utilized to prevent an imminent magnetic saturation of the coils/transformers/leakage inductance involved, in particular, the main inductance current of the coils/transformers, leakage inductance is preferably always regulated to zero. How the main inductance current is recorded is not relevant to the present invention.

All of circuits 1 shown in FIG. 1 through 10 can be used for simulating an electrical load. This electrical load is to be simulated at a terminal 2 of a test circuit 3 in order to test test circuit 3. Test circuit 3 is typically a control unit to be tested, which is then also often referred to as DUT (device under test). Test circuit 3 has at least one first switch 4 and one second switch 5; circuit 1 has a third switch 6 and a fourth switch 7, first switch 4 and second switch 5 of test circuit 3 being connected via a shared, first internal connection point 8 to terminal 2 of test circuit 3, and third switch 6 and fourth switch 7 being interconnected via a shared, internal connection point 9. Here, first switch 4 and second switch 5 of test circuit 3 signify the output stage of test circuit 3, such test-circuit output stages often outputting PWM voltage signals that are generated by a half bridge encompassing two switches, via terminal 2 of interest, as is also possible in the case of test circuits 3 shown here. Third switch 6 and fourth switch 7 of the circuit are controllable by a regulating device (not shown in the figure), in particular as a function of the operation of first switch 4 and second switch 5 of test circuit 3. First switch 4 and second switch 5 of test circuit 3 are locked against each other, i.e., these switches 4, 5 are not able to be in the same switch position simultaneously. In the same way, third switch 6 and fourth switch 7 of circuit 1 are not able to be simultaneously connected.

First switch 4 and third switch 6 are interconnected via a first external connection point 10, and second switch 5 is connected to fourth switch 7 via a second external connection point 11. A supply voltage $U_B$ from a voltage source 30 is supplied to first external connection point 10 and second external connection point 11, and actual current $i_{actual}$ flowing over the terminal of test circuit 3 flows over transverse bridge branch 12 configured between terminal 2 and second connection point 9. Therefore, together with transverse bridge branch 12, first switch 4, second switch 5, third switch 6 and fourth switch 7 form an H-bridge circuit.

To be able to actually simulate a load at terminal 2 of test circuit 3, actual current $i_{actual}$ must be regulated to a setpoint value, which is realized in all of the exemplary embodiments illustrated in FIG. 1 through 10 in that, in transverse bridge branch 12, a controllable voltage source 13 is provided, as is an inductance 14 that is active therein; and actual current $i_{actual}$ is adjustable by a current-control unit 15 acting on controllable voltage source 13 to the value of a predefined setpoint current $i_{setpoint}$.

In the exemplary embodiment according to FIG. 1, controllable voltage source 13 is configured directly in transverse bridge branch 12, so that the voltage supplied by controllable voltage source 13 is able to be fed directly via a galvanic coupling into transverse bridge branch 12. It is readily apparent that, by varying the voltage supplied by controllable voltage source 13, the current flow in transverse bridge branch 12 may be directly influenced and be adjusted by normal controllers to the value of a predefined setpoint current $i_{setpoint}$.

Figure 2:
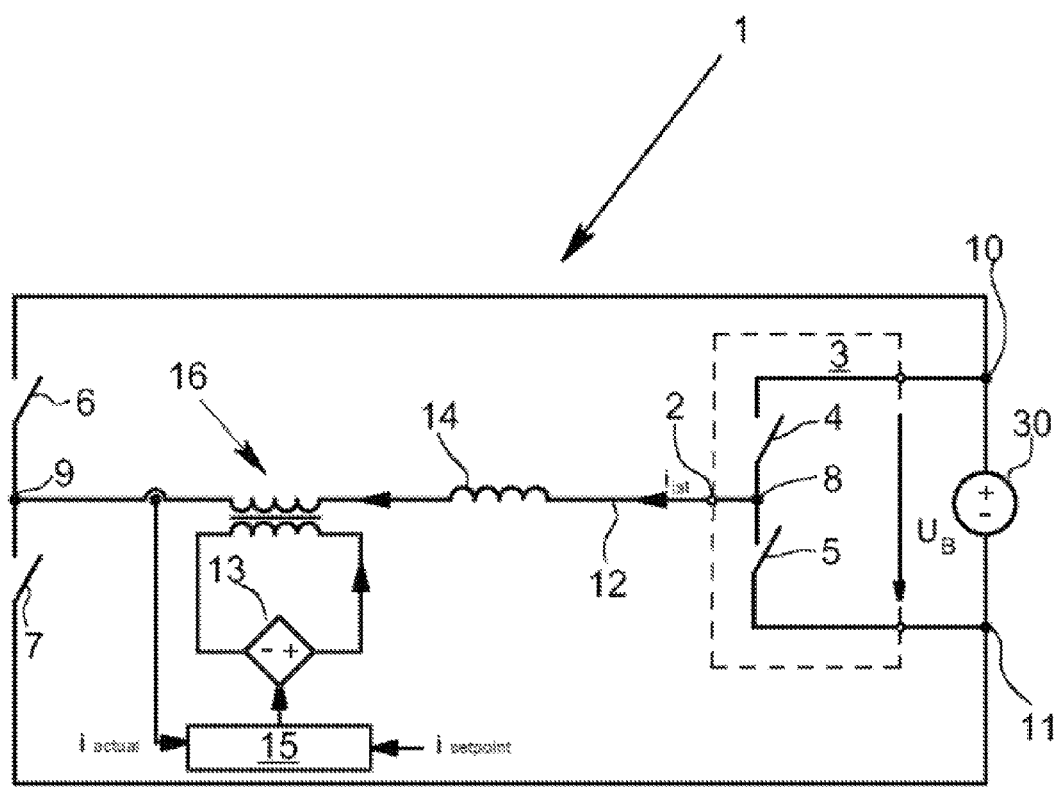
FIG. 2 shows another schematic circuit diagram of another circuit according to another embodiment of the present invention for simulating an electrical load including inductive voltage coupling.

In the case of the circuit according to FIG. 2, the voltage supplied by controllable voltage source 13 is coupled indirectly via an inductive coupling into transverse bridge branch 12; in the present case, the inductive coupling being realized by a transformer 16. Thus, voltage source 13 controlled by current-control unit 15 influences the primary-side current of transformer 16, transformer 16 transmitting the current—respectively, the voltage generated by the current change achieved on the primary side—on the secondary side into transverse bridge branch 12. Since, as a general principle, it is only possible to transmit alternating currents over an inductive coupling, indirectly acting controllable voltage source 13 according to FIG. 2 is only able to influence alternating components of the current in the transverse bridge branch. The direct component of the load current flowing in transverse bridge branch 12 is then regulated by properly switching first switch 6 and second switch 7 of circuit 1 relative to first switch 4 and second switch 5 of test circuit 3, the characteristics of first switch 4 and of second switch 5 of test circuit 3 not being influenceable in the sense of an active control, but rather being determined by test circuit 3. The inductive coupling of the voltage supplied by controllable voltage source 13 is also realized in the exemplary embodiments in accordance with FIG. 4 through 9.

Figure 3:
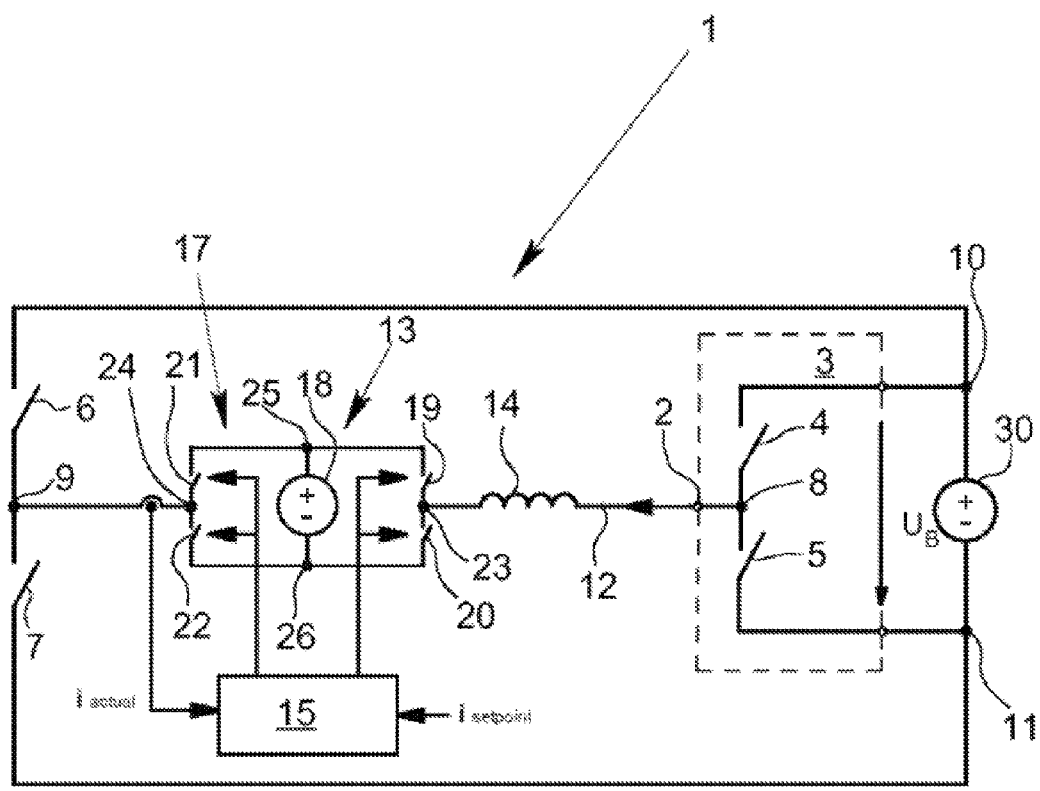
FIG. 3 shows a circuit diagram of a circuit according to an embodiment of the present invention, in which case the controllable voltage source is realized as a four-quadrant capable switchover device having an internal voltage source.
Figure 4:
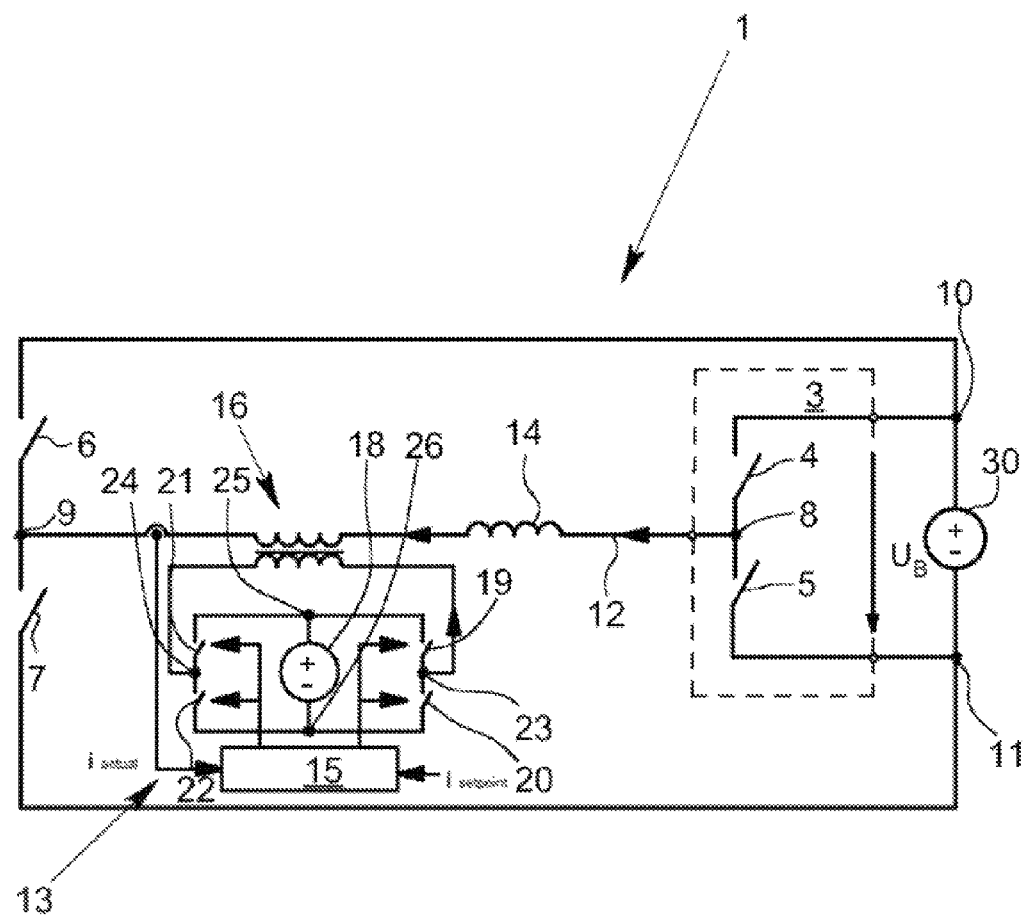
FIG. 4 shows a circuit, which, with respect to the realization of the controlled voltage source, is comparable to FIG. 3, however, having an inductively coupled, controlled voltage.

FIGS. 3 and 4 show one special realization of controllable voltage source 13, including a four-quadrant capable switchover device 17 having an internal voltage source 18. Due to the four-quadrant capability of switchover device 17, it is possible to allow internal voltage source 18 to become active in different orientations in transverse bridge branch 12, regardless of whether controllable voltage source 13 in the form of four-quadrant capable switchover device 17 is coupled directly or inductively into transverse bridge branch 12.

At any rate, four-quadrant capable switchover device 17 has a first switch 19, a second switch 20, a third switch 21, and a fourth switch 22; first switch 19 being connected via a first bridge connection 23 to second switch 20; and second switch 20 being connected to fourth switch 22; fourth switch 22 being connected via a second bridge connection 24 to third switch 21; and third switch 21 likewise being connected to first switch 19; internal voltage source 18 being connected to shared connection 25 of first switch 19 and of third switch 21; and, in addition, internal voltage source 18 being connected to shared connection 26 of second switch 20 and of fourth switch 22.

Four-quadrant capable switchover device 17 is actively coupled into transverse bridge branch 12 via first bridge connection 23 and second bridge connection 24. In the circuit in accordance with FIG. 3, four-quadrant capable switchover device 17 forms both an H-bridge circuit, as well as—as required—the circuit composed of first switch 4, second switch 5, third switch 6 and fourth switch 7, so that, altogether, illustrated circuit 1 may be described as a cascaded H-bridge circuit. By simultaneously closing first switch 19 and fourth switch 22 of switchover device 17 while simultaneously opening second switch 20 and third switch 21 of switchover device 17, internal voltage source 18 may be coupled in a first orientation into transverse bridge branch 12, and, given an opening or closing of switches 19, 20, 21 and 22 in exactly the opposite sense, internal voltage source 18 may be coupled into transverse bridge branch 12 in an orientation that is opposite thereto, and become active.

To compensate for always present electrical losses and to change the load current flowing over terminal 2 of test circuit 3 on a larger scale that can no longer be handled by controllable voltage source 13, it is necessary to use the external H-bridge circuit that encompasses first switch 4 and second switch 5 of test circuit 3 and first switch 6 and second switch 7 of circuit 1, as well as of transverse bridge branch 12 between terminal 2 of test circuit 3 and second internal connection point 9. To this end, it is provided that circuits 1 be operable in a power-consuming or supplying mode, or, however, in a power-neutral operation, during which regulation is carried out "on a small scale" exclusively via controllable voltage source 13 in conjunction with current-control unit 15.

To implement the power-neutral operation, illustrated circuits 1 are configured in such a way that third switch 6 of circuit 1 is synchronously operated with first switch 4 of test circuit 3, and fourth switch 7 of circuit 1 is synchronously operated with second switch 5 of test circuit 3; first switch 4 of test circuit 3 and third switch 6 of circuit 1 being essentially operated in push-pull mode in synchronism with second switch 5 of test circuit 3 and fourth switch 7 of circuit 1. In this mode, only two electric circuits may be realized in which voltage source 30 is not active.

On the other hand, in the case of illustrated circuits 1, the power-consuming or supplying operation is realized in that voltage source 30 is actively switched into transverse bridge branch 12, namely in that third switch 6 of circuit 1 is not synchronously connected to first switch 4 of test circuit 3, respectively, fourth switch 7 of circuit 1 is not connected synchronously to second switch 5 of test circuit 3, but rather with a certain delay, so that a slightly delayed operating mode of switches 4 and 6, respectively of switches 5 and 7 results, and a chronologically overlapping operating mode of switches 4 and 7, respectively 5 and 6 is thereby realized. As a result, voltage source 30 is always connected in series with transverse bridge branch 12 and—depending on the polarity—has a current-reducing or amplifying effect in transverse bridge branch 12. Given the galvanic coupling of controllable voltage source 13 and the realization of internal voltage source 18 as an energy storage device in the form of a capacitor, the power-consuming or supplying operation serves in the present context for charging or discharging the energy storage device.

In FIG. 1 through 4 and 6 through 9, inductance 14 that is active in transverse bridge branch 12 is realized in each case as a coil. However, in other exemplary embodiments not described here, it suffices when inductance 14 that is active in transverse bridge branch 12 is realized parasitically as leakage or line inductance, i.e., is not at all embodied as a component.

Figure 5:
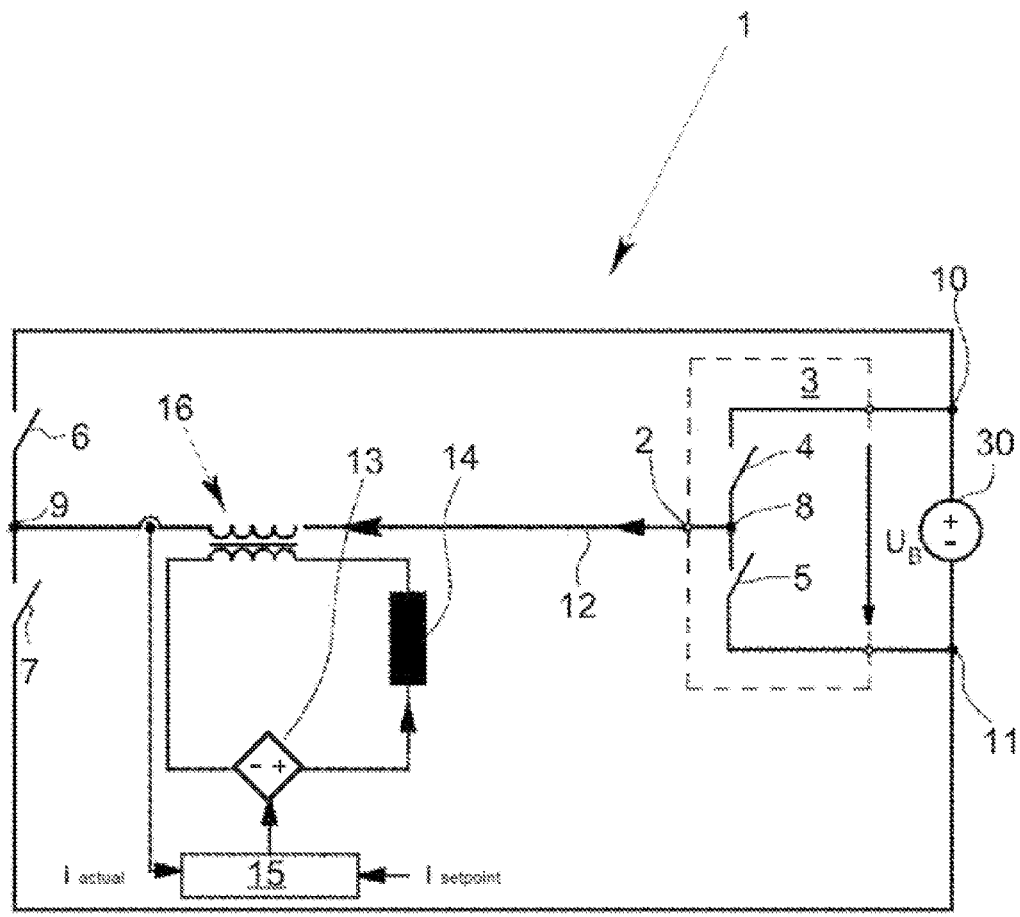
FIG. 5 shows the circuit diagram of a circuit according to an embodiment of the present invention, in which case, the inductance that is active in the transverse bridge branch is implemented on the primary side in the case of the inductive coupling of the controlled voltage.

In the exemplary embodiment in accordance with FIG. 5, inductance 14 that is active in transverse bridge branch 12 is realized as a coil on the primary side in controllable voltage source 13; naturally, this also signifying that the coil need not be configured as a unit with voltage source 13, but rather that it be configured in the electric circuit in which controllable voltage source 13 is active, as is also illustrated in FIG. 5.

Figure 6:
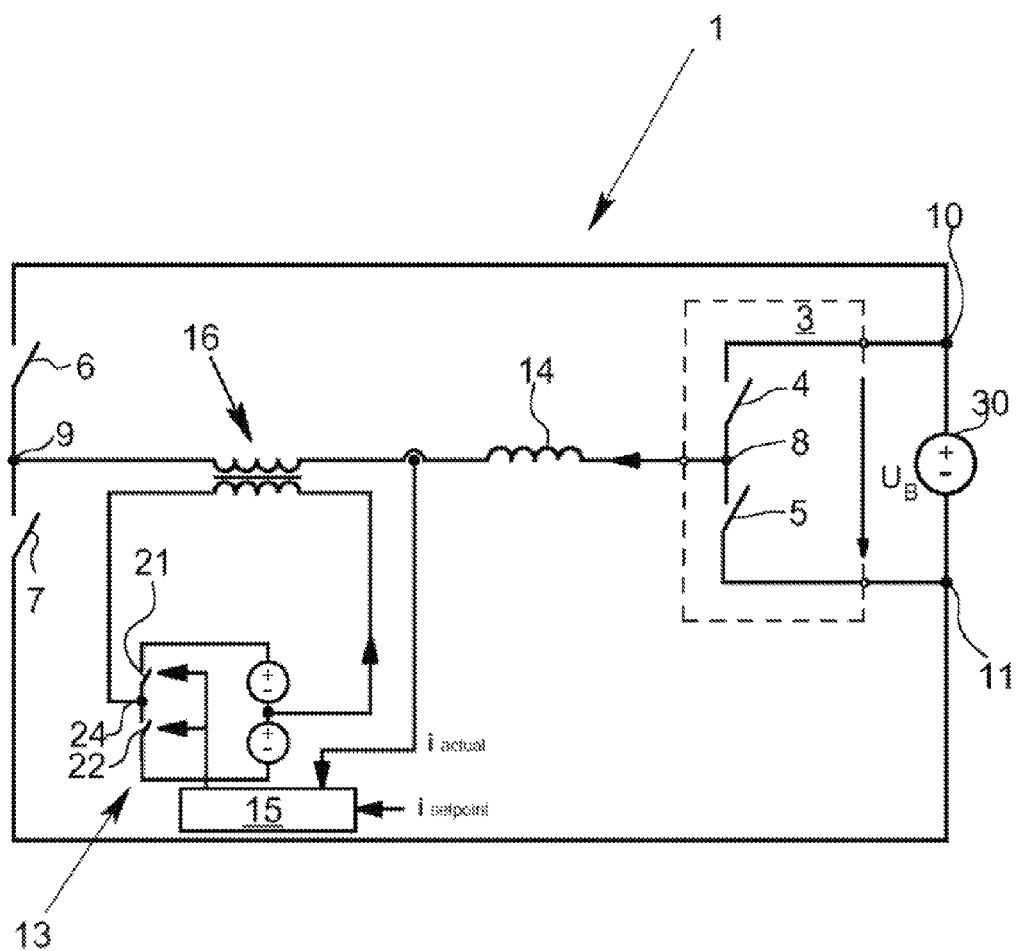
FIG. 6 shows the circuit diagram of a circuit according to an embodiment of the present invention, in which case the controllable voltage source is realized as a half-bridge output stage.

In the exemplary embodiment in accordance with FIG. 6, controllable voltage source 13 is not realized as a complete H-bridge circuit, but rather as a half bridge having two internal voltage sources, that in design and control is less complex than the approach that provides for a full bridge.

Figure 7:
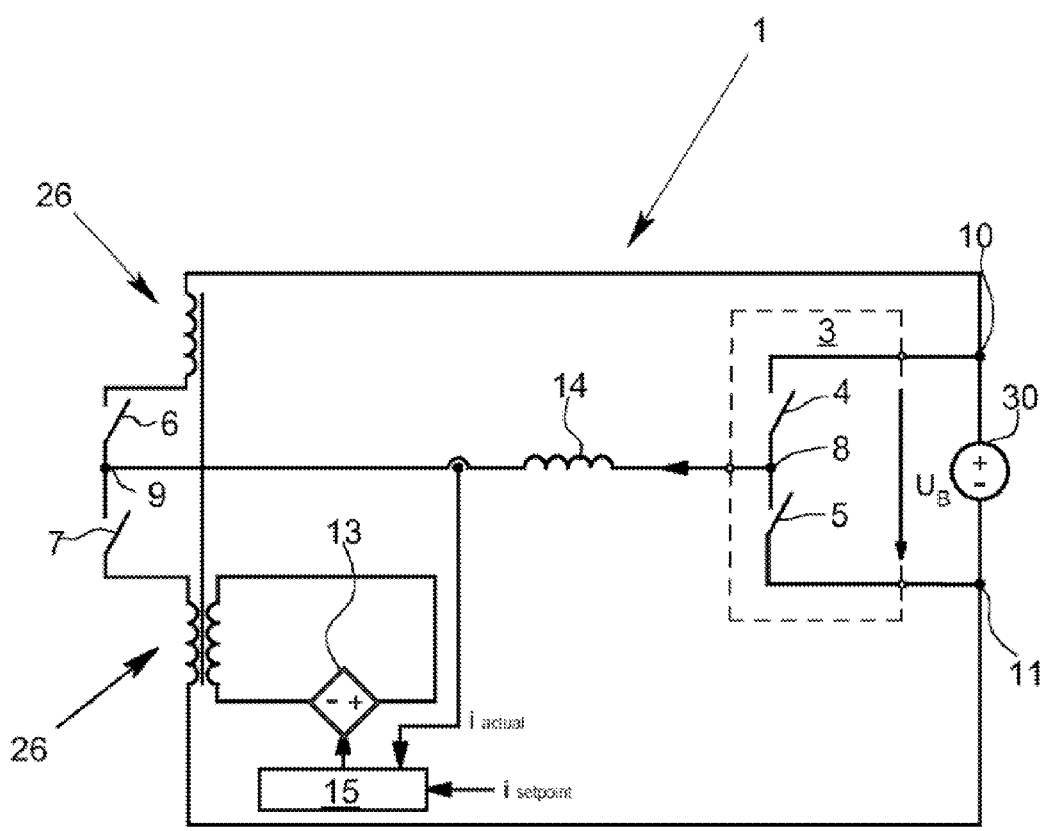
FIG. 7 shows the circuit diagram of another circuit according to an embodiment of the present invention, where the transformer-based coupling of the controllable voltage is carried out via a three-winding transformer.
Figure 8:
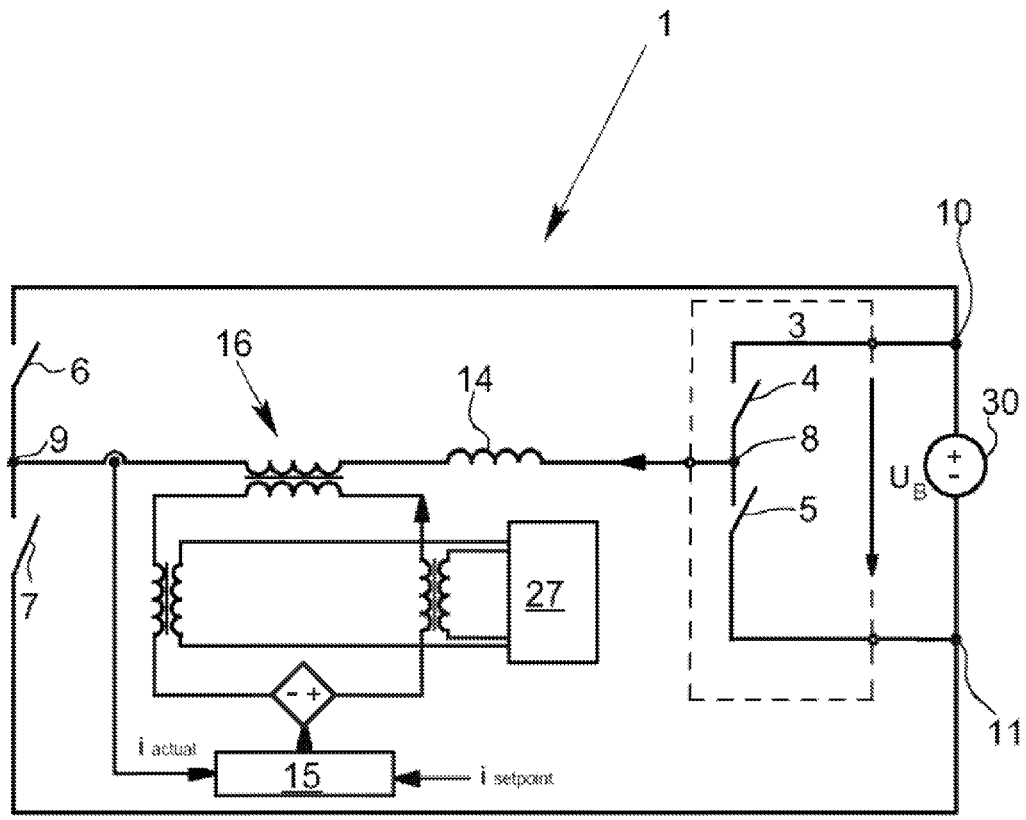
FIG. 8 shows the circuit diagram of another circuit according to an embodiment of the present invention having inductive coupling.
Figure 9:
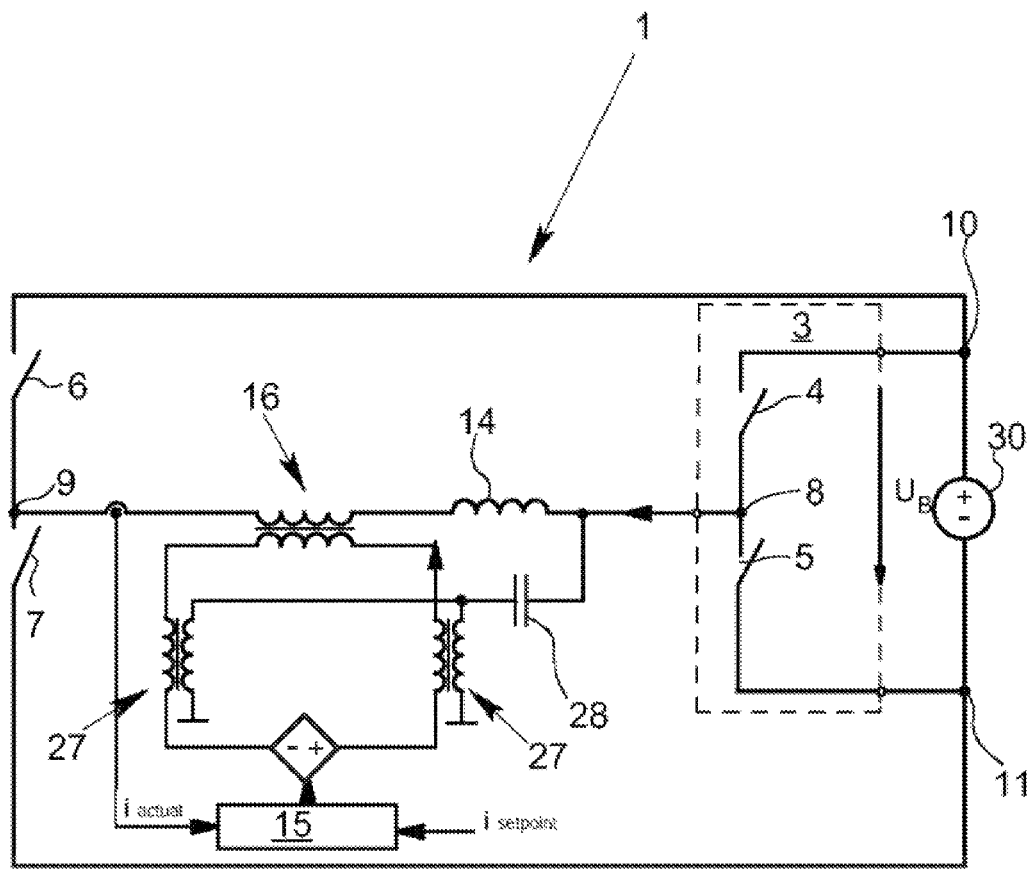
FIG. 9 shows the circuit diagram of a circuit according to an embodiment of the present invention in accordance with FIG. 8, the common-mode rejection taking place in a voltage-controlled process.

The alternative approach illustrated in FIG. 7 influences the current in transverse bridge branch 12 by influencing the currents flowing at any one time in one of the two possible electric circuits of the H-bridge circuit; in the present case, a three-winding transformer 26 being used due to its simple design. This ensures that the primary side of the transformer used for the control will not be configured on a jumping potential. In the case of the circuit in accordance with FIG. 8, an active common-mode rejection is realized by a control 27, which is also realized in the variant in accordance with FIG. 9; in this case, however, using the voltage present at terminal 2 of test circuit 3, a suppression of the direct component being effected via coupling capacitor 28.

Figure 10:
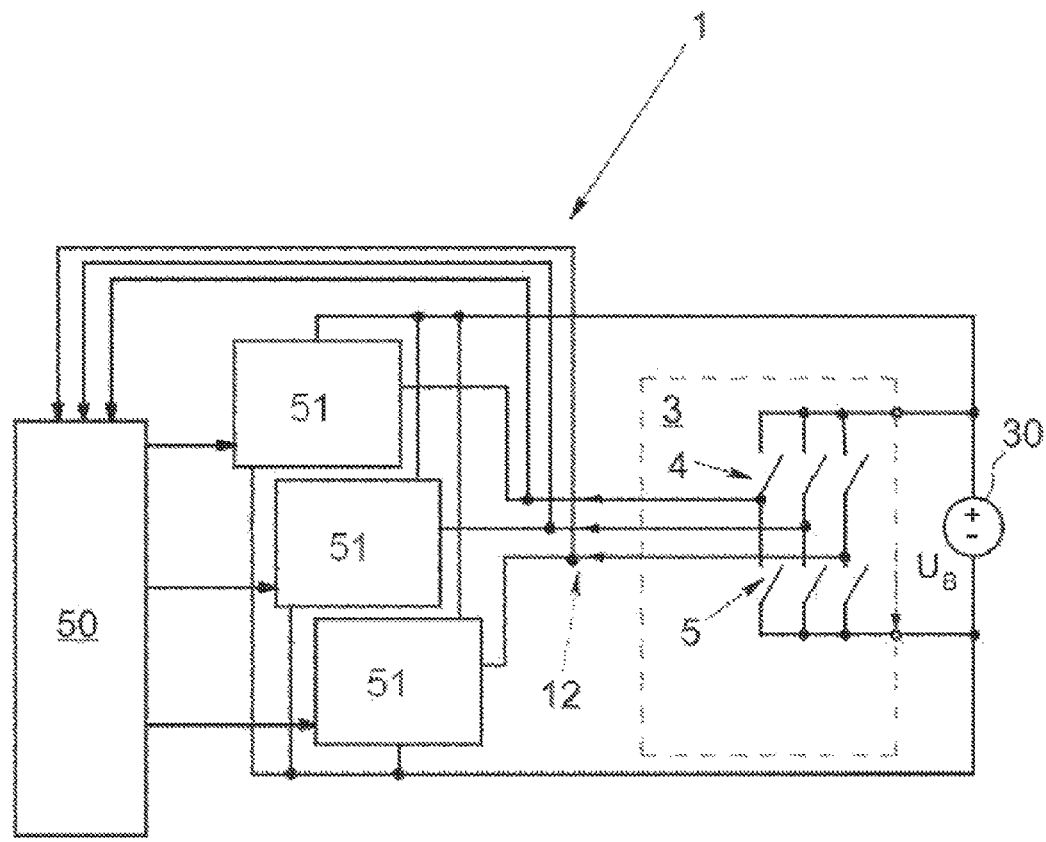
FIG. 10 shows a schematic circuit diagram of the circuit according to an embodiment of the present invention in three-phase operation.

As a general principle, FIG. 10 illustrates that circuit 1 according to the present invention for simulating an electrical load may be used not only in single-phase operation, but also for setting only one current path at only one terminal or terminal pair of a test circuit, but rather that the circuit may also be readily used for those application cases where a multi-phase electrical load is to be simulated. In this case, for each phase to be simulated, a circuit according to the present invention for simulating a load is provided. The circuits may be readily used when the load to be simulated has a central connection point ("star point"). In this case, the simulation model ensures that the total current over all connected phases is equal to zero.

FIG. 10 also illustrates how a simulation model 50 of an electric motor calculates the currents of the real load from the voltages measured at the phases, and applies them as current setpoint values to actual load section 51 of circuits 1 according to the present invention. Actual load section 51 of circuits 1 according to the present invention is provided multiple times—in this case in triplicate—in accordance with the multi-phase—in this case, three-phase configuration, and, independently of the particular realization variant of circuit 1, essentially includes switches 6 and 7 in each case, controllable voltage source 13, active inductance 14 and current-control unit 15. In this context, the current setpoint values generated by simulation model 50 are impressed in accordance with the preceding explanations upon current-control unit 15 contained in actual load section 51 which adjusts the current in the phases.

While the invention has been particularly shown and described with reference to preferred embodiments thereof, it will be understood by those skilled in the art that various changes in form and details may be made therein without departing from the spirit and scope of the invention.

The invention claimed is:

1. A circuit for simulating an electrical load at a terminal of a test circuit, the test circuit having at least one first switch and at least one second switch, the circuit comprising:
    a third switch connected to the at least one first switch of the test circuit via a first external connection point;
    a fourth switch connected to the at least one second switch of the test circuit via a second external connection point, the at least one first switch and the at least one second switch being connected via a shared, first internal connection point to the terminal of the test circuit and the third switch and the fourth switch being connected via a shared, second internal connection point such that that the at least one first switch, the at least one second switch, the third switch and the fourth switch form an H-bridge circuit;
    a voltage source configured to provide the first external connection point and the second external connection point with a supply voltage;
    a controllable voltage source connected in a transverse bridge branch between the terminal and the second internal connection point;
    an inductance active in the transverse bridge branch; and
    a current-control unit operable on the controllable voltage source so as to adjust, to a predetermined setpoint current, an actual current flowing over the terminal of the test circuit and over the transverse bridge branch.

2. The circuit as recited in claim 1, wherein a galvanic coupling is configured to feed a voltage supplied by the controllable voltage source directly into the transverse bridge branch.

3. The circuit as recited in claim 1, wherein an inductive coupling is configured to feed a voltage supplied by the controllable voltage source indirectly into the transverse bridge branch.

4. The circuit as recited in claim 3, wherein the inductive coupling includes at least one transformer configured to indirectly feed the voltage supplied by the controllable voltage source indirectly into the transverse bridge branch.

5. The circuit as recited in claim 1, wherein the controllable voltage source includes a four-quadrant capable switchover device having an internal voltage source.

6. The circuit as recited in claim 5, wherein the internal voltage source includes an energy storage device having a capacitor.

7. The circuit as recited in claim 5, wherein the four-quadrant capable switchover device includes a first switch, a second switch, a third switch and a fourth switch, and wherein:
- the first switch of the switchover device is connected via a first bridge connection to the second switch of the switchover device;
- the second switch of the switchover device is connected to the fourth switch of the switchover device;
- the fourth switch of the switchover device is connected via a second bridge connection to the third switch of the switchover device;
- the third switch of the switchover device is connected to the first switch of the switchover device; and
- the internal voltage source is connected to a shared connection of the first switch of the switchover device and of the third switch of the switchover device, as well as to a shared connection of the second switch of the switchover device and of the fourth switch of the switchover device.

8. The circuit as recited in claim 7, wherein the internal voltage source includes a capacitor.

9. The circuit as recited in claim 1, wherein the inductance that is active in transverse bridge branch is provided by at least one of a coil, a leakage and a line inductance.

10. The circuit as recited, claim 1, wherein the inductance that is active in the transverse bridge branch is provided by a leakage inductance of a transformer.

11. The circuit as recited in claim 10, wherein the transformed is configured as at least one of a leakage transformer and a dual-winding coil.

12. The circuit as recited in claim 1, wherein the circuit is configured such that, in a power-neutral operation: the third switch of the circuit is synchronously operated with the at least one first switch of the test circuit; the fourth switch of the circuit is synchronously operated with the at least one second switch of the test circuit; and the at least one first switch of the test circuit and the third switch of the circuit are substantially operated in push-pull mode in synchronism with the at least one second switch of the test circuit and the fourth switch of the circuit.

13. The circuit as recited in claim 1, wherein the circuit is configured such that, in a power-consuming operation and in a power-supplying operation, the voltage source is actively switched into the transverse bridge branch.

14. The circuit as recited in claim 13, wherein the circuit is configured such that, in the power-consuming operation and in the power-supplying operation, at least one of the third switch and the fourth switch of the circuit is connected, respectively, to the at least one first switch and the at least one second switch of the test circuit with a predetermined delay.

15. The circuit as recited in. claim 14, wherein the circuit is configured such that the power-consuming operation and the power-supplying operation each prevent an imminent magnetic saturation of at least one of a coil, a transformer and a leakage inductance in an inductive coupling of the controllable voltage source to the transverse bridge branch.

16. The circuit as recited in claim 15, wherein the circuit is configured such that, in the power-consuming operation and in the power-supplying operation, a main inductance current of the at least one of a coil, a transformer and a leakage inductance is regulated to zero.

17. The circuit as recited in claim 14, wherein the circuit is configured such that the power-consuming operation and the power-supplying operation respectively discharge and charge an energy storage device by a galvanic coupling configured to feed a voltage supplied by the controllable voltage source directly into the transverse bridge branch.

18. The circuit as recited in claim 17, wherein the controllable voltage source includes a four-quadrant capable switehover device having an internal voltage source.

19. The circuit as recited in claim 18, wherein the internal voltage source includes at least one of a capacitor and a battery.

* * * * *